United States Patent

Chung et al.

Patent Number: 5,444,021
Date of Patent: Aug. 22, 1995

[54] METHOD FOR MAKING A CONTACT HOLE OF A SEMICONDUCTOR DEVICE

[75] Inventors: In S. Chung, Ichonkun; Youn J. Kim, Bundangku, both of Rep. of Korea

[73] Assignee: Hyundai Electronics Industries Co., Ltd., Kyoungkido, Rep. of Korea

[21] Appl. No.: 141,821

[22] Filed: Oct. 22, 1993

[30] Foreign Application Priority Data

Oct. 24, 1992 [KR] Rep. of Korea ............... 19682/1992

[51] Int. Cl.$^6$ .................... H01L 21/44; H01L 21/48
[52] U.S. Cl. .................... 437/195; 437/193; 437/228; 437/235; 148/DIG. 20
[58] Field of Search .......... 437/195, 187, 228; 148/DIG. 20

[56] References Cited

U.S. PATENT DOCUMENTS

| | | | |
|---|---|---|---|
| 4,696,098 | 9/1987 | Yen | 437/187 |
| 4,808,552 | 2/1989 | Anderson | 437/187 |
| 5,100,838 | 3/1992 | Dennison | 437/195 |
| 5,262,352 | 11/1993 | Woo et al. | 437/195 |
| 5,318,925 | 6/1994 | Kim | 437/195 |

*Primary Examiner*—Olik Chaudhuri
*Assistant Examiner*—H. Jey Tsai
*Attorney, Agent, or Firm*—Merchant, Gould, Smith, Edell, Welter & Schmidt

[57] ABSTRACT

A method for making a contact hole during manufacture of a semiconductor device. The method whereby, in a state that there is formed an arrangement which consists of one or more conductive materials insulated with a first insulating film on a contact region, a contact hole is so formed on the contact region as not to electrically connect with the arrangement, comprising the steps of: applying an etching process to the first insulating film to expose a part of the conductive material by means of a photosensitive pattern, said first insulating film remaining in part; removing the exposed part of the conductive material by means of etching; forming a second insulating film to a predetermined thickness over the resulting structure taking into consideration of the size of the contact hole desired; applying an anisotropic etching process to the second insulating film to form a spacer insulating film; and etching the remaining first insulating film along the spacer insulating film so as to form the contact hole on the contact region. The method results in improved device reliability and improved production yield.

3 Claims, 9 Drawing Sheets

METHOD FOR MAKING A CONTACT HOLE OF A SEMICONDUCTOR DEVICE

BACKGROUND OF THE INVENTION

1. Field of the invention

The present invention relates in general to a method for making a contact hole during manufacture of a semiconductor device and more particularly to a method resulting in improvement in securing clearance in a micro contact hole.

2. Description of the Prior Art

Generally, as a semiconductor is highly integrated, cell area must become smaller. For the purpose of scaling a cell down, it is required to shorten gate length or to reduce the size of contact. In this regard, specification for designing highly integrated semiconductor devices are moving in a direction of greater stringency, so that it is becoming more difficult to form a contact hole in a small space.

Hereinafter, description of a conventional method for making a contact hole is given for better understanding of the background of the invention with reference to the drawings.

Referring initially to FIG. 1, a conventional embodiment is described briefly. This figure shows a conventional contact hole in a plan view. As shown in FIG. 1, a plurality of parallel, first spaced-apart polysilicon films 2 are perpendicular to a plurality of second parallel, spaced-apart polysilicon films 4.

Referring now to FIG. 2, there is a cross-sectional elevation view of the conventional embodiment of FIG. 1 taken generally through section line A—A' of FIG. 1. This drawing shows the relationship between first polysilicon film 2 and second polysilicon film 4 and a lower layer. As shown in FIG. 2, a first oxide film 1 is covered with the first polysilicon film 2 on which a second oxide film 3, the second polysilicon film 4 and a third oxide film 5 are formed in due order. This resulting structure is mounted on an impurity diffusion region. Using a mask, the first, second and third oxide film are subjected to the treatment of etching so as to form a contact hole. However, this conventional method has a disadvantage such that on micro-patterning, clearance is not sufficient. That is is spaces a and b where the method are carried out is very small, as shown in FIG. 2.

Since the conventional method has very small clearances, even a small error in mask arrangement causes such a problem that an inter-layer conductive material can be exposed to the contact hole. FIG. 3 shows misaligned mask arrangement in an embodiment according to the conventional method. FIG. 4, which is a cross-sectional elevation view of the conventional embodiment of FIG. 3 taken generally through section line A—A' of FIG. 3, shows that inter-layer conductive materials 2' and 4' are exposed to the contact hole and will be connected with a conductive layer to be deposited later.

SUMMARY OF THE INVENTION

Therefore an object of the present invention is to solve the aforementioned problems encountered in the prior art and to provide a method for making a contact hole during manufacture of a highly integrated semiconductor device, capable of securing sufficient clearance when the method is carried out.

According to an aspect of the present invention, this object can be accomplished with a method for making a contact hole in the manufacture of a semiconductor device whereby, in a state that there is formed an arrangement which consists of conductive material insulated with a first insulating film on a contact region, a contact hole is so formed on the contact region as not to electrically connect with the arrangement, comprising the steps of: using a photosensitive pattern, applying a first etching process to the first insulating film to expose a part of the conductive material, said first insulating film remaining in part; removing the part of said conductive material exposed by said first etching process to form a resulting structure with remaining conductive material; forming a second insulating film over the resulting structure; applying an anisotropic etching process to the second insulating film to form a spacer insulating film over the remaining conductive material; and applying a second etching process to the first insulating film along the spacer insulating film so as to form the contact hole on the contact region.

According to another aspect of the present invention, there is provided a method for making a contact hole during manufacture of a semiconductor device whereby, in a state that there is formed an arrangement which consists of conductive material insulated with a first insulating film on a contact region, the contact hole is so formed on the contact region as not to electrically connect with the arrangement, comprising the steps of: depositing an obstacle to etching the first insulating film over the first insulating film; using a photosensitive pattern, etching the first insulating film and the obstacle to expose a part of the conductive material, said first insulating film remaining in part; removing the part of the conductive material exposed to form a resulting structure with remaining conductive material; forming a second insulating film over the resulting structure; applying an anisotropic etching process to the second insulating film to form a spacer insulating film over the remaining conductive material; and etching the first insulating film along the spacer insulating film so as to form the contact hole on the contact region.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE INVENTION

Hereinafter, preferred embodiments of the invention are described in detail with reference to the drawings.

Figure 1:
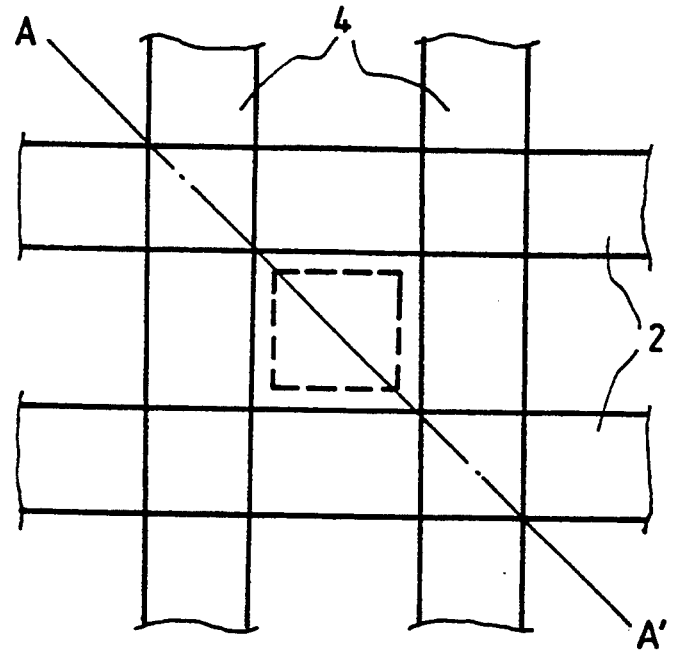
FIG. 1 is a plan view showing a contact hole according to a conventional method.
Figure 2:
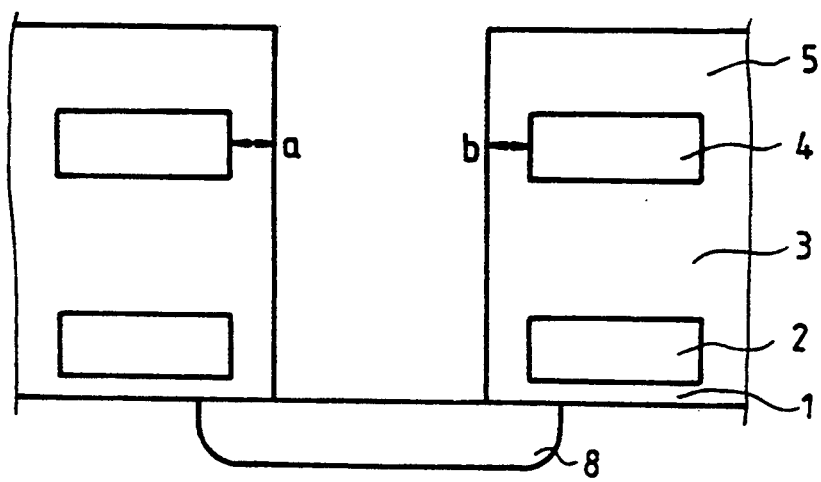
FIG. 2 is a cross-sectional elevation view of the conventional embodiment of FIG. 1 taken generally through section line A—A' of FIG. 1.
Figure 3:
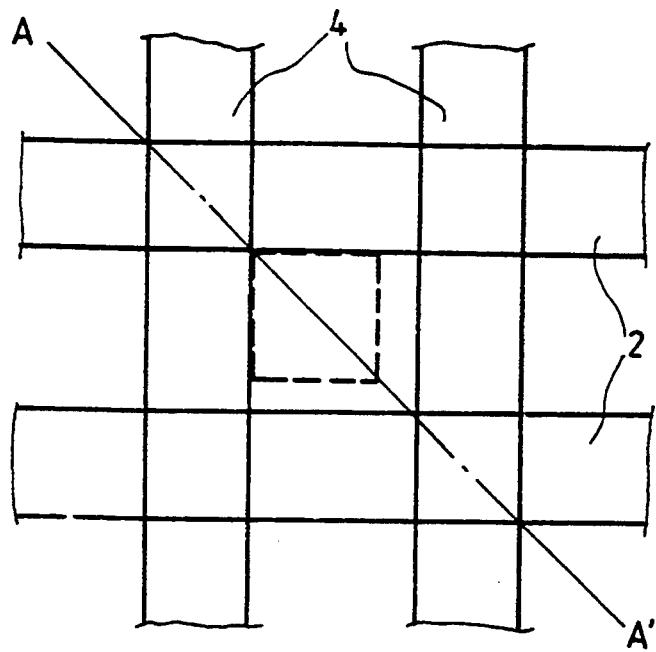
FIG. 3 is a plan view showing a misaligned contact hole according to a conventional method.
Figure 4:
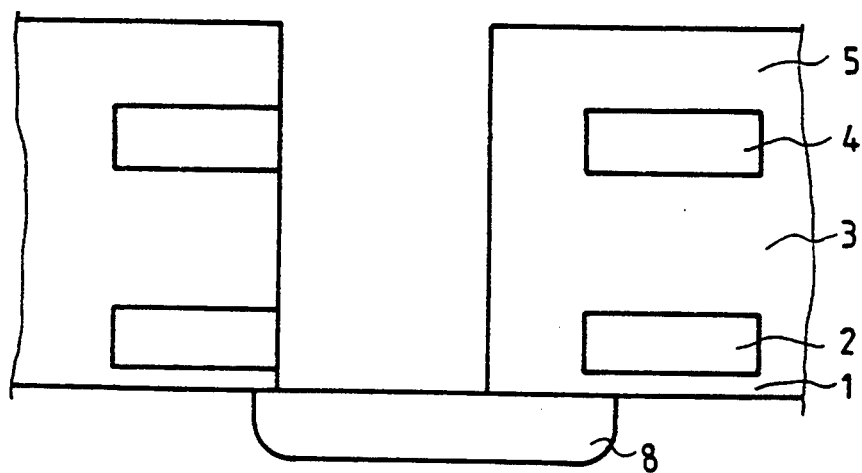
FIG. 4 is a cross-sectional elevation view of the conventional embodiment of FIG. 2 taken generally through section line A—A' of FIG. 2.
Figure 5:
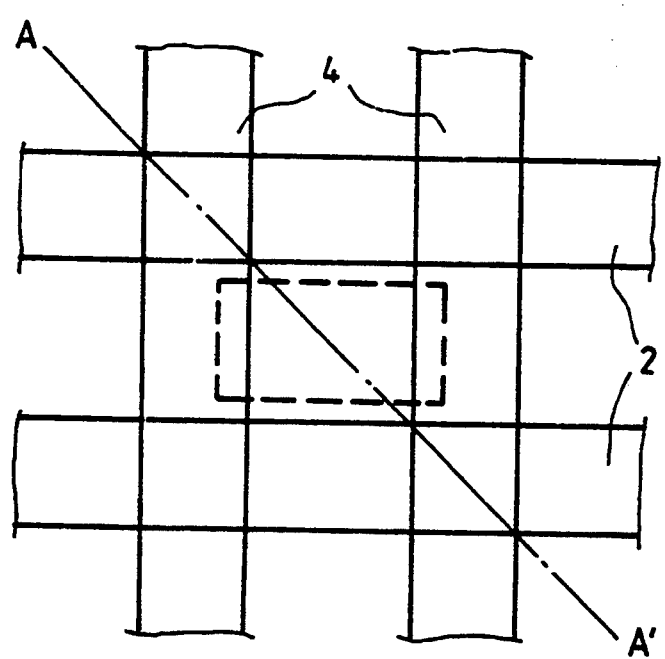
FIG. 5 is a plan view showing a contact hole in accordance with the present invention.

First, referring to FIG. 5, there is a plan view showing an embodiment according to the present invention. As shown in FIG. 5, a plurality of first parallel, spaced-apart polysilicon films 2 is perpendicular to a plurality of second parallel, spaced-apart polysilicon films 4 and there is used a mask (shown as dot line) which is larger than a practical area wherein a contact is be formed.

Referring now to FIGS. 6A to 6E, there is schematic cross-sectional views illustrating processing steps, respectively, which are taken generally through section line A—A' of FIG. 5.

Figure 6A:
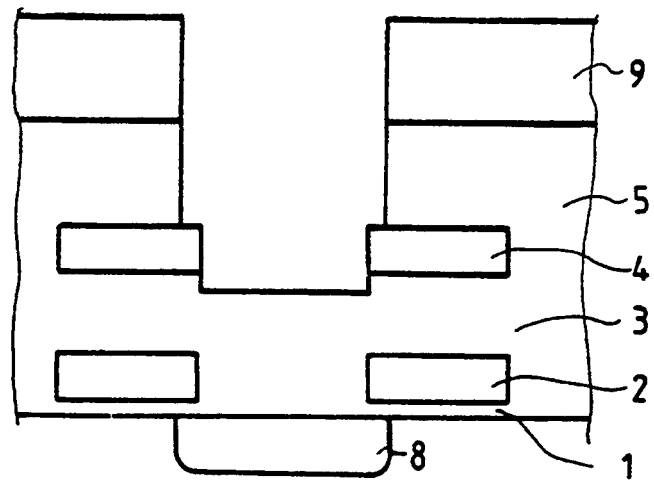
FIGS. 6A–6E is a step diagram relative to FIG. 5 illustrating the method according to the invention.

Firstly, as shown in FIG. 6A, a first oxide film 1 is covered with a first polysilicon 2, a conductive material, on which a second oxide film 3, a second polysilicon film 4 and a third oxide film 5 are formed in due order, the first and second polysilicon films 2 and 4 being insulated with the above oxide films 1, 3 and 5. This resulting structure is mounted on an impurity diffusion region 8. In this state, using a photosensitive film 9, the third oxide film is etched in such a predetermined portion as to expose a part of the second polysilicon film 4 and to remove a part of the upper portion of the second oxide film 3, as shown in FIG. 6A.

Figure 6B:
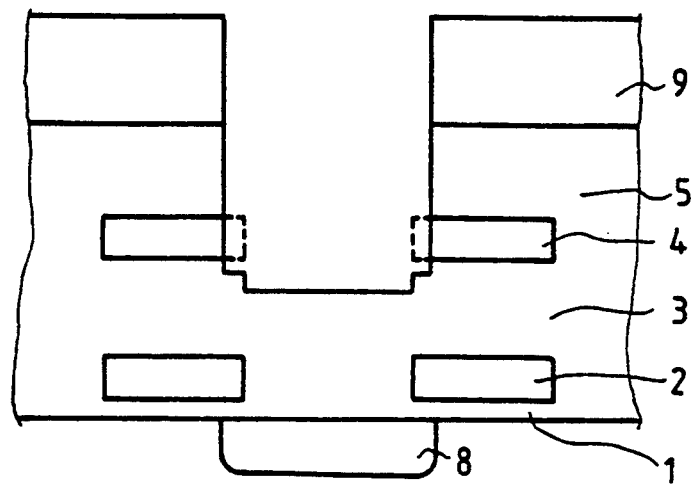

Next, the exposed second polysilicon film 4 is subjected to etching so as to be partially removed, as shown in FIG. 6B. At this time, the etching of the exposed polysilicon film 4 must be performed within such a degree of care that the characteristic of the device is not affected greatly.

Figure 6C:
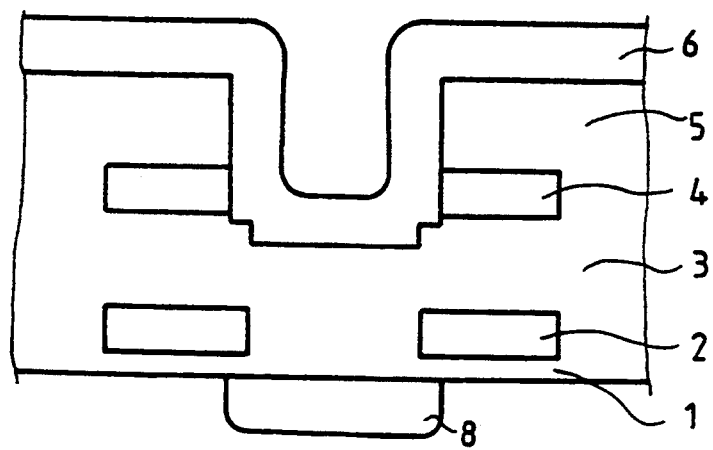

Subsequently, on considering the size of the contact hole, an insulating oxide film 6 is formed over the resulting structure, as shown in FIG. 6C.

Figure 6D:
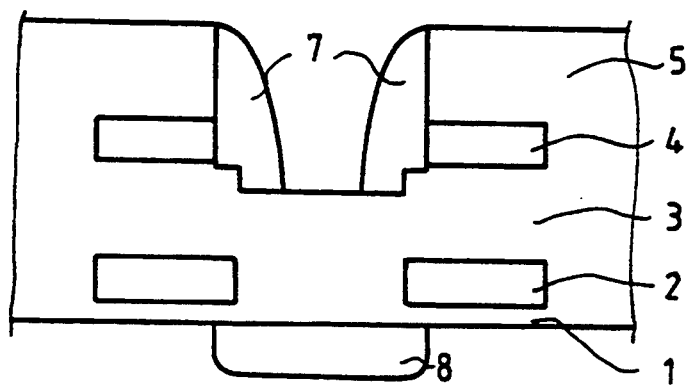

As shown in FIG. 6D, the deposited oxide film 6 is subjected to the treatment of anisotropic etching so as to form a pair of spacer oxide films 7. The width of the spacer oxide film 7 determines the size of a contact hole to be formed later.

Figure 6E:
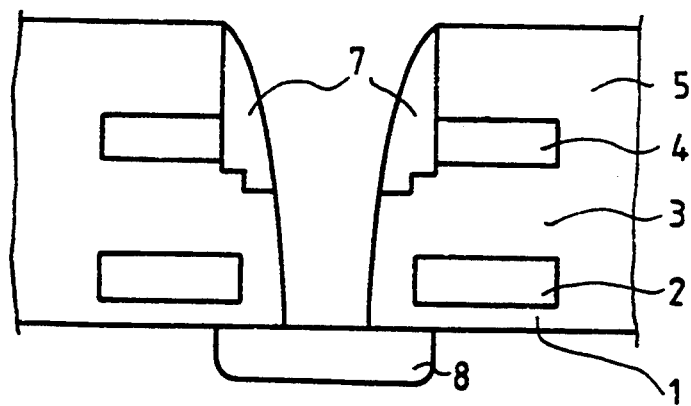
Figure 7A:
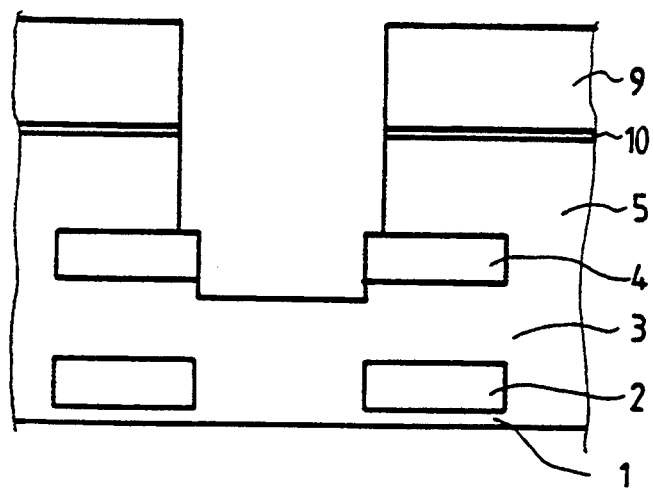
FIGS. 7A–7E is a step diagram illustrating the method of an alternate embodiment according to the invention.
Figure 7B:
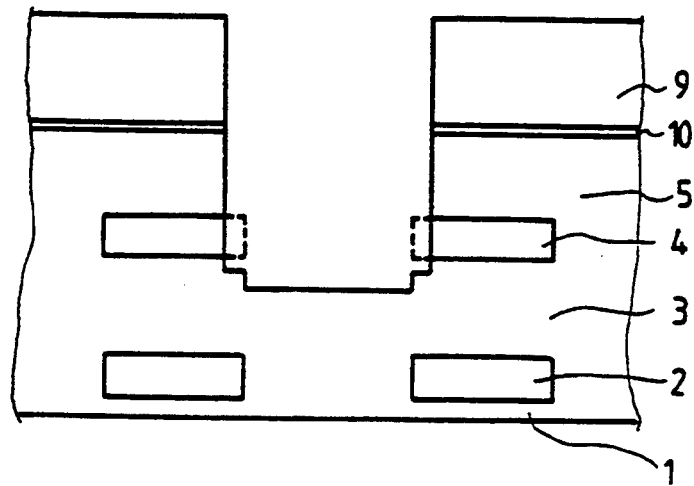
Figure 7C:
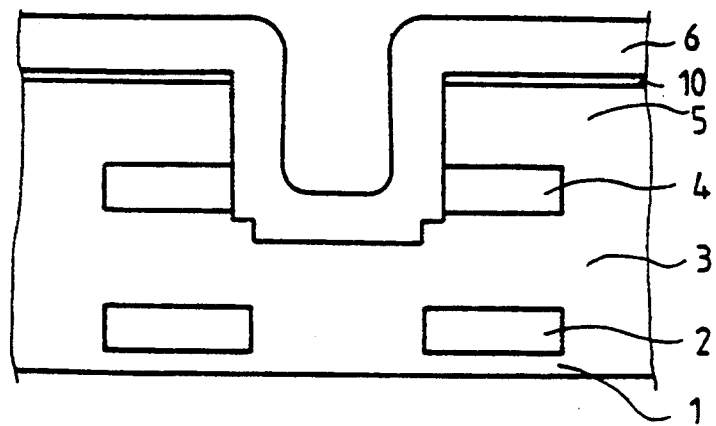
Figure 7D:
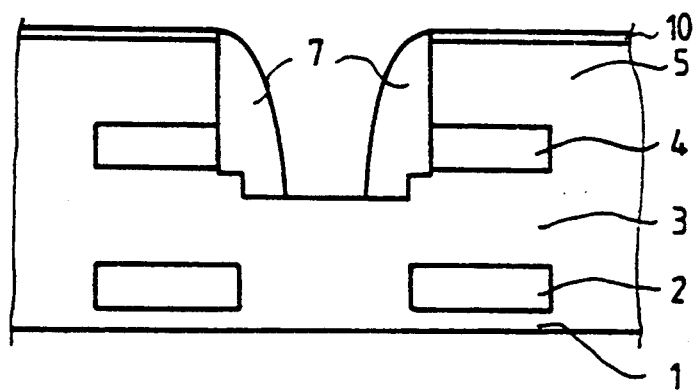
Figure 7E:
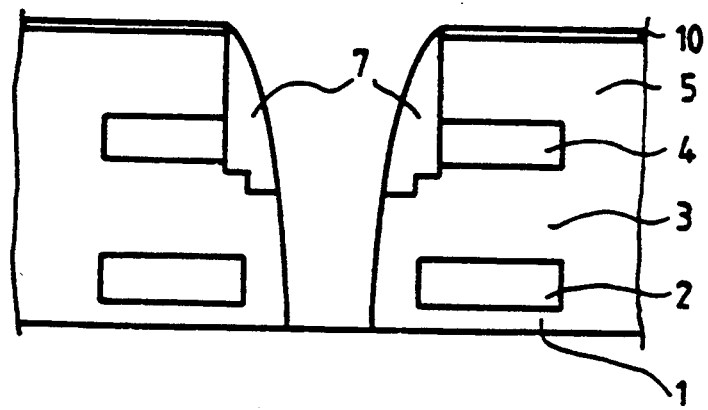

Lastly, FIG. 6E shows a contact hole which is formed on the impurity diffusion region by etching the remaining second oxide film along the spacer oxide film 7.

Turning now to FIGS. 7A to 7E, there are elevation cross-sectional views showing processing steps, respectively, in accordance with the other embodiment of the present invention. In this embodiment, a step of forming an obstacle to etching is provided. In other words, a nitride film or a polysilicon film 10 is deposited on the third oxide film 5 of FIG. 6A in order to prevent the second polysilicon film 4 from being exposed excessively by the over etch of the third oxide film 5.

As described above, the method according to the present invention is capable of securing clearance. Accordingly, in accordance with the present invention, not only is the reliability of the device improved, but also improved production yield is obtained.

Whilst the present invention has been described with reference to certain preferred embodiments, it will be appreciated by those skilled in the art that numerous variations and modifications are possible without departing from the spirit or scope of the invention as broadly described.

What is claimed is:

1. A method for making a contact hole during manufacture of a semiconductor device whereby, in a state that there is formed an arrangement which consists of first and second layers of conductive material insulated therebetween and with respect to a contact region with a first insulating film, the contact hole is so formed on the contact region as not to electrically connect with the arrangement, comprising the steps of:

using a photosensitive pattern, applying a first etching process to the first insulating film to expose a part of said first layer of said conductive material, said first insulating film remaining in part;

removing said part of said first layer of said conductive material exposed by said first etching process to form a resulting structure with remaining conductive material relative to said first layer;

forming a second insulating film over the resulting structure;

applying an anisotropic etching process to said second insulating film to form a spacer insulating film over said remaining conductive material to have an opening width; and applying a second etching process to the first insulating film along said spacer insulting film through said opening width so as to avoid said second layer of conductive material and form the contact hole on said contact region.

2. A method for making a contact hole during manufacture of a semiconductor device whereby, in a state that there is formed an arrangement which consists of first and second layers of conductive material insulated therebetween and with respect to a contact region with a first insulating film, the contact hole is so formed on the contact region as not to electrically connect with the arrangement, comprising the steps of:

depositing an obstacle to etching said first insulating film over said first insulating film;

using a photosensitive pattern, etching said first insulating film and the obstacle to expose a part of said conductive material, said first insulating film remaining in part;

removing the part of said conductive material exposed to form a resulting structure with remaining conductive material;

forming a second insulating film over the resulting structure;

applying an anisotropic etching process to the second insulating film to form a spacer insulating film over said remaining conductive material to have an opening width; and etching the first insulating film along said spacer insulating film through said opening width so as to avoid said second layer of conductive material and form the contact hole on said contact region.

3. A method according to claim 2, in which said obstacle to etching is selected from the group consisting of a polysilicon film and silicon nitride film.

* * * * *